(12) United States Patent
Wu et al.

(10) Patent No.: US 9,907,207 B1
(45) Date of Patent: Feb. 27, 2018

(54) LIQUID-COOLING HEAT DISSIPATING MODULE

(71) Applicant: AURAS Technology Co., Ltd., New Taipei (TW)

(72) Inventors: An-Chih Wu, New Taipei (TW); Mu-Shu Fan, New Taipei (TW); Chien-Yu Chen, New Taipei (TW)

(73) Assignee: AURAS TECHNOLOGY CO., LTD., New Taipei (TW)

( * ) Notice: Subject to any disclaimer, the term of this patent is extended or adjusted under 35 U.S.C. 154(b) by 0 days.

(21) Appl. No.: 15/262,330

(22) Filed: Sep. 12, 2016

(30) Foreign Application Priority Data

Aug. 26, 2016 (TW) .............................. 105127466 A

(51) Int. Cl.
*H05K 7/20* (2006.01)
(52) U.S. Cl.
CPC ................................ *H05K 7/20272* (2013.01)
(58) Field of Classification Search
CPC ........... H05K 7/20254; H05K 7/20272; H05K 7/20509; H01L 23/473; G06F 1/20; G06F 2200/201
See application file for complete search history.

(56) References Cited

U.S. PATENT DOCUMENTS

| | | | | |
|---|---|---|---|---|
| 6,556,439 B2* | 4/2003 | Shibasaki | ............... | G06F 1/203 165/80.2 |
| 7,156,160 B2* | 1/2007 | Lee | ........................... | G06F 1/20 165/104.33 |
| 7,272,006 B2* | 9/2007 | Mongia | ............... | H01L 23/4006 165/80.4 |
| 7,325,591 B2* | 2/2008 | Duan | ..................... | H01L 23/473 165/104.33 |
| 7,404,433 B1* | 7/2008 | Hu | ........................ | H01L 23/473 165/104.33 |
| 7,472,743 B2* | 1/2009 | Liu | ........................... | G06F 1/20 165/104.33 |
| 2005/0183848 A1* | 8/2005 | Cheng | ....................... | F28F 3/12 165/104.33 |
| 2006/0067052 A1* | 3/2006 | Llapitan | ............. | F28D 1/05375 361/700 |

FOREIGN PATENT DOCUMENTS

FR          2568364 A1 *  1/1986  .............. B23P 15/26

* cited by examiner

*Primary Examiner* — Tho V Duong
(74) *Attorney, Agent, or Firm* — WPAT, PC

(57) ABSTRACT

A liquid-cooling heat dissipating module includes a water-cooling radiator, a water-cooling head and an external pump. The water-cooling radiator includes a radiator inner channel, a radiator outlet tube and a radiator inlet tube. The water-cooling head assembly includes a water-cooling head and a bracket. The water-cooling head includes a first chamber, a head inlet and a head outlet. The head outlet is connected with the radiator inlet tube. The bracket is contacted with the water-cooling head. The external pump is contacted with the water-cooling head assembly. The external pump includes a second chamber, a pump inlet, a pump outlet and a pump tube. Two ends of the pump tube are connected with the pump outlet and the head inlet, respectively. The radiator inner channel, the radiator outlet tube, the radiator inlet tube, the first chamber, the pump tube and the second chamber are in fluid communication.

6 Claims, 9 Drawing Sheets

LIQUID-COOLING HEAT DISSIPATING MODULE

FIELD OF THE INVENTION

The present invention relates to a liquid-cooling heat dissipating module, and more particularly to a liquid-cooling heat dissipating module with an external pump and a water-cooling head assembly.

BACKGROUND OF THE INVENTION

With increasing development of computers and various electronic products, people of the modern societies often spend lot of time in using computers and various electronic products. In case that the computer or the electronic product has been operated for a long time, the heat generated by the computer or the electronic product cannot be dissipated away quickly.

Generally, for most of the electronic products, thermal greases or heat sinks are attached on the heat generation components of the electronic products to absorb the heat from the heat generation components and dissipate the heat away. As known, the heat dissipating efficiency of using the thermal grease or the heat sink is usually unsatisfied.

FIG. 1 schematically illustrates the architecture of a conventional liquid-cooling heat dissipating module. As shown in FIG. 1, the liquid-cooling heat dissipating module 6 comprises a water-cooling radiator 61, a water-cooling head 62 and a water pump 63. Every two of the water-cooling radiator 61, the water-cooling head 62 and the water pump 63 are connected with each other through a pipe 67. Consequently, the water-cooling radiator 61, the water-cooling head 62 and the water pump 63 are in fluid communication with each other. However, since the water-cooling radiator 61, the water-cooling head 62 and the water pump 63 are not fixed on each other, these components are dispersedly arranged. Under this circumstance, the space utilization is usually unsatisfied.

Therefore, the conventional liquid-cooling heat dissipating module needs to be further improved.

SUMMARY OF THE INVENTION

For solving the drawbacks of the conventional technologies, the present invention provides a liquid-cooling heat dissipating module. An external pump and a water-cooling head assembly of the liquid-cooling heat dissipating module are contacted and assembled with each other. Consequently, the space utilization is enhanced.

In accordance with an aspect of the present invention, there is provided a liquid-cooling heat dissipating module. The liquid-cooling heat dissipating module includes a water-cooling radiator, a water-cooling head and an external pump. The water-cooling radiator includes a radiator inner channel, a radiator outlet tube and a radiator inlet tube. The water-cooling head assembly includes a water-cooling head and a bracket. The water-cooling head includes a first chamber, a head inlet and a head outlet. The head outlet is connected with the radiator inlet tube. The bracket is contacted with the water-cooling head and fixed on an external object. The external pump is contacted with the water-cooling head assembly. The external pump includes a second chamber, a pump inlet, a pump outlet and a pump tube. Moreover, two ends of the pump tube are connected with the pump outlet and the head inlet, respectively. The radiator inner channel, the radiator outlet tube, the radiator inlet tube, the first chamber, the pump tube and the second chamber are in fluid communication with each other.

In an embodiment, the water-cooling head assembly further includes a position-limiting element. After the position-limiting element is connected with the bracket, a clamping space is defined by the position-limiting element and the bracket collaboratively, the external pump is accommodated within the clamping space, and the external pump is clamped by the position-limiting element and the bracket.

In an embodiment, two bent supporting structures are extended from the bracket in a direction away from the first chamber. The position-limiting element includes a middle pressing part and two coupling parts. The two coupling parts are respectively located at two ends of the middle pressing part. The external pump is covered and pressed by the middle pressing part of the position-limiting element. Moreover, the two coupling parts of the position-limiting element are fixed on the two bent supporting structures.

In an embodiment, the bracket is an I-shaped bracket. The bracket includes a middle supporting segment and two lateral supporting segments. The two lateral supporting segments are respectively connected to the two ends of the middle supporting segment. The water-cooling head further includes a concave structure. The middle supporting segment is received within the concave structure. The two lateral supporting segments are extended beyond the water-cooling head. Each of the two lateral supporting segments includes at least one fastening hole. Moreover, at least one fastening element is penetrated through the corresponding fastening hole and tightened in the external object.

In an embodiment, the external pump is a cylindrical pump. The pump inlet is located at a bottom side of the cylindrical pump. The pump outlet is located at a lateral side of the cylindrical pump.

In an embodiment, the radiator inner channel includes a left communication channel part, a right communication channel part, an upper chamber and a lower chamber. The upper chamber and the lower chamber are separated from each other. The radiator inlet tube is in communication with the lower chamber. The radiator outlet tube is in communication with the upper chamber. Moreover, two ends of the left communication channel part are respectively connected with the upper chamber and the lower chamber. Moreover, two ends of the right communication channel part are respectively connected with the upper chamber and the lower chamber. After a fluidic medium is introduced into the lower chamber through the radiator inlet tube, the fluidic medium separately flows toward a left side and a right side to the upper chamber through the left communication channel part and the right communication channel part, and then the right communication channel part and the fluidic medium is introduced to the external pump though the radiator outlet tube.

In an embodiment, the liquid-cooling heat dissipating module further includes two fan modules. The two fan modules are arranged beside the left communication channel part and the right communication channel part, respectively. The two fan modules guide airflow toward the left communication channel part and the right communication channel part, respectively.

In accordance with another aspect of the present invention, there is provided a liquid-cooling heat dissipating module. The liquid-cooling heat dissipating module includes a water-cooling radiator, a water-cooling head and an external pump. The water-cooling radiator includes a radiator inner channel, a radiator outlet tube and a radiator inlet tube. The water-cooling head assembly includes a water-cooling head and a bracket. The water-cooling head includes a first chamber, a head inlet and a head outlet. The head outlet is connected with the radiator inlet tube. The bracket is contacted with the water-cooling head and fixed on an external object. The external pump includes a second chamber, a pump inlet, a pump outlet and an adapter part. The external pump is directly coupled and fixed to the water-cooling head assembly through the adapter part. Moreover, two ends of the adapter part are connected with the pump outlet and the head inlet, respectively. The radiator inner channel, the radiator outlet tube, the radiator inlet tube, the first chamber, the adapter part and the second chamber are in fluid communication with each other.

In an embodiment, the bracket is an I-shaped bracket. The bracket includes a middle supporting segment and two lateral supporting segments. The two lateral supporting segments are respectively connected to the two ends of the middle supporting segment. The water-cooling head further includes a concave structure. The middle supporting segment is received within the concave structure. The two lateral supporting segments are extended beyond the water-cooling head. Each of the two lateral supporting segments includes at least one fastening hole. Moreover, at least one fastening element is penetrated through the corresponding fastening hole and tightened in the external object.

In an embodiment, the external pump is a cylindrical pump. The pump inlet is located at a bottom side of the cylindrical pump. The pump outlet is located at a lateral side of the cylindrical pump.

In an embodiment, the radiator inner channel includes a left communication channel part, a right communication channel part, an upper chamber and a lower chamber. The upper chamber and the lower chamber are separated from each other. The radiator inlet tube is in communication with the lower chamber. The radiator outlet tube is in communication with the upper chamber. Moreover, two ends of the left communication channel part are respectively connected with the upper chamber and the lower chamber. Moreover, two ends of the right communication channel part are respectively connected with the upper chamber and the lower chamber. After a fluidic medium is introduced into the lower chamber through the radiator inlet tube, the fluidic medium separately flows toward a left side and a right side to the upper chamber through the left communication channel part and the right communication channel part, and then the right communication channel part and the fluidic medium is introduced to the external pump though the radiator outlet tube.

In an embodiment, the liquid-cooling heat dissipating module further includes two fan modules. The two fan modules are arranged beside the left communication channel part and the right communication channel part, respectively. The two fan modules guide airflow toward the left communication channel part and the right communication channel part, respectively.

In an embodiment, the adapter part is extended from the pump outlet, and the adapter part is directly coupled with the head inlet.

In an embodiment, the adapter part is an adapter ring, and two ends of the adapter ring are respectively directly coupled with the head inlet and the pump outlet. The head inlet is made of a first material, and the pump outlet is made of a second material different from the first material.

From the above descriptions, the present invention provides the liquid-cooling heat dissipating module. The external pump and the water-cooling head assembly of the liquid-cooling heat dissipating module are contacted and assembled with each other. Consequently, the layout space is saved, and more space is provided to accommodate other components. Moreover, since the external pump is directly coupled with the water-cooling head assembly, the pressure drop of the fluidic medium is decreased.

The above objects and advantages of the present invention will become more readily apparent to those ordinarily skilled in the art after reviewing the following detailed description and accompanying drawings, in which:

DETAILED DESCRIPTION OF THE PREFERRED EMBODIMENT

Figure 1:
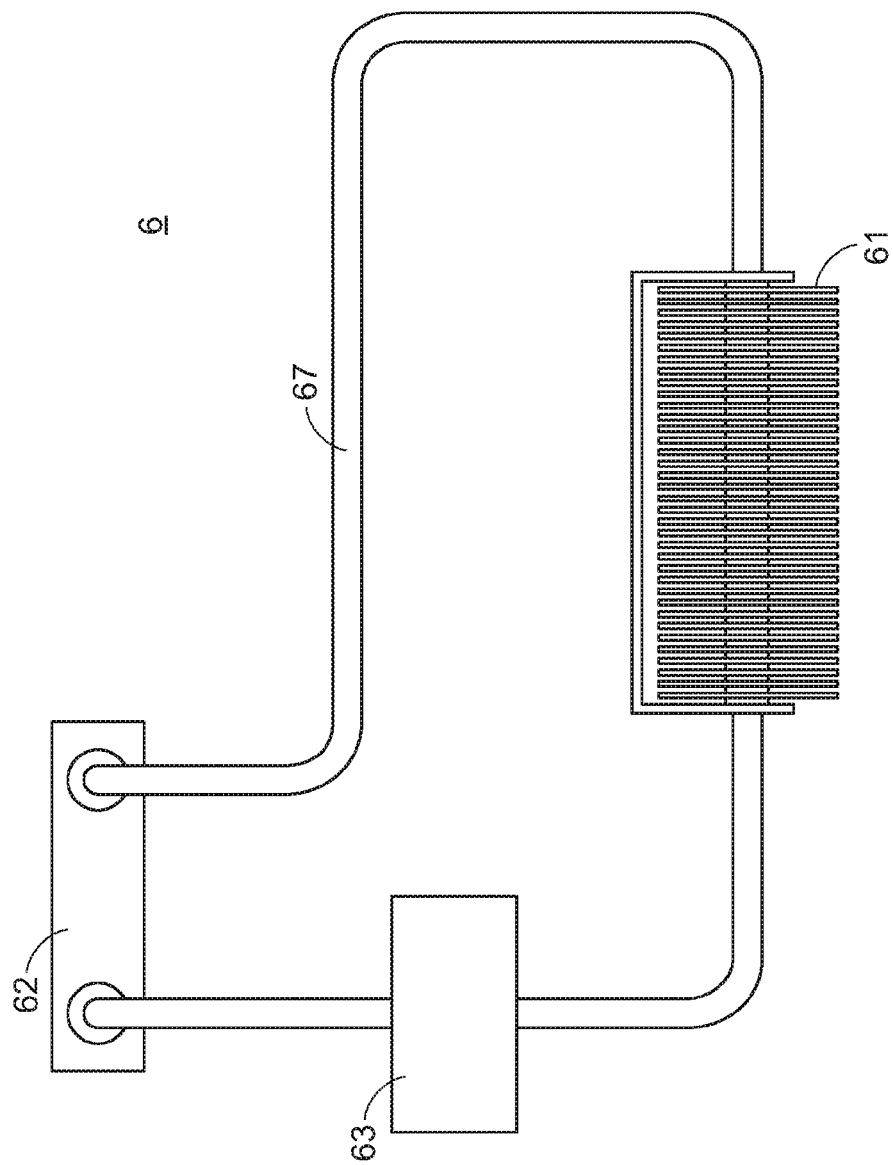
FIG. 1 schematically illustrates the architecture of a conventional liquid-cooling heat dissipating module.
Figure 2:
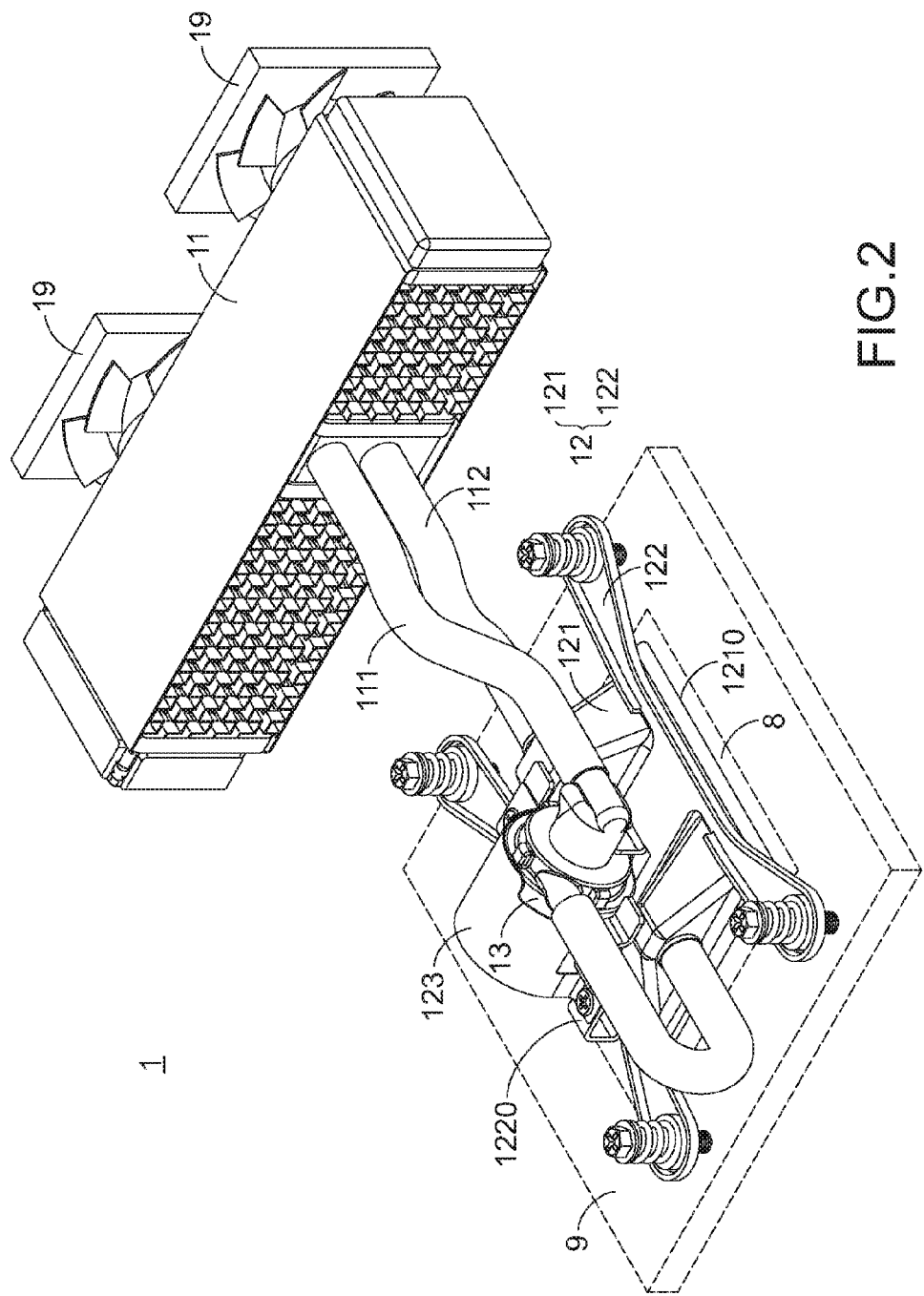
FIG. 2 is a schematic perspective view illustrating the architecture of a liquid-cooling heat dissipating module according to a first embodiment of the present invention.
Figure 3:
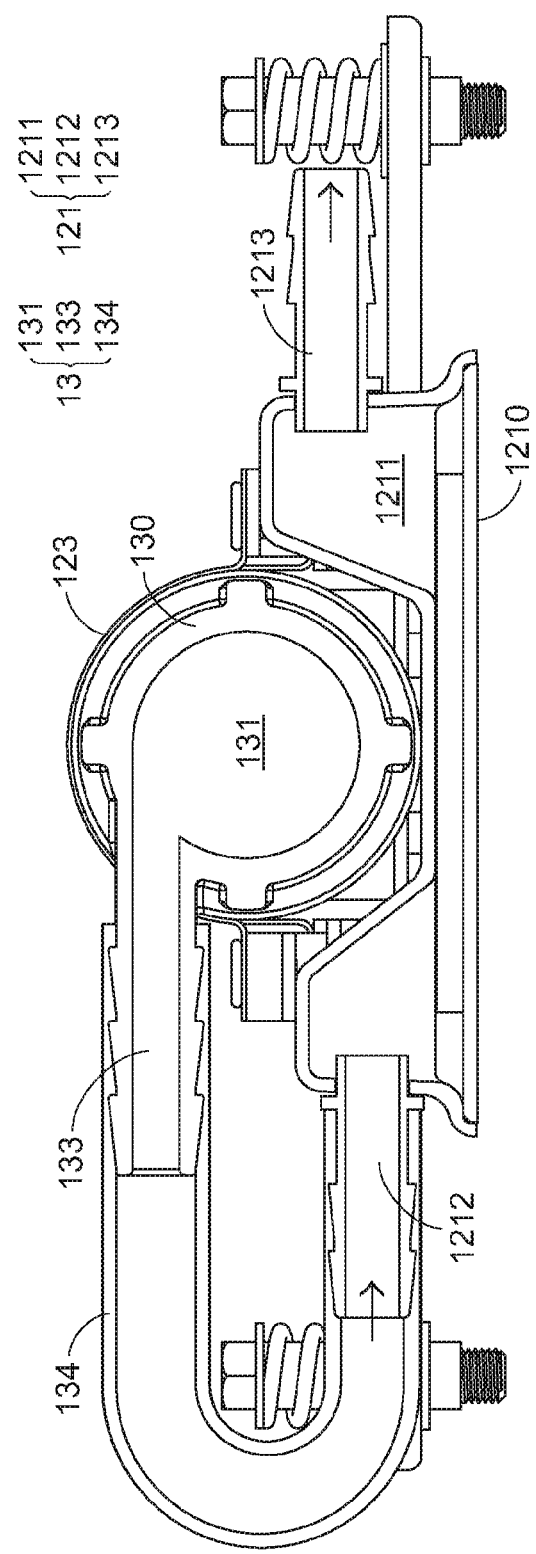
FIG. 3 is a schematic cross-sectional view illustrating a water-cooling head assembly and an external pump of the liquid-cooling heat dissipating module according to the first embodiment of the present invention.
Figure 4:
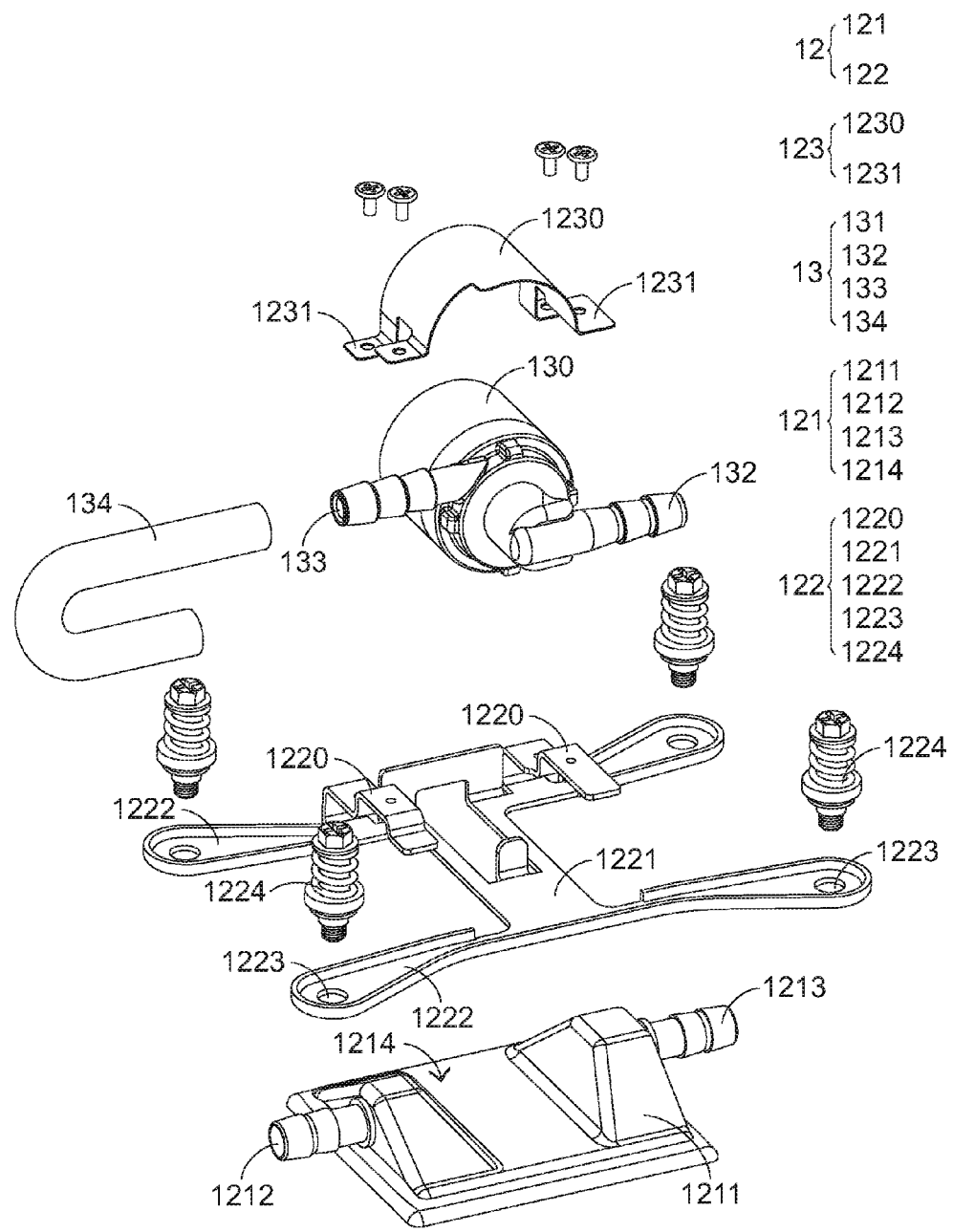
FIG. 4 is a schematic exploded view illustrating the water-cooling head assembly and the external pump of the liquid-cooling heat dissipating module according to the first embodiment of the present invention.

FIG. 2 is a schematic perspective view illustrating the architecture of a liquid-cooling heat dissipating module according to a first embodiment of the present invention. FIG. 3 is a schematic cross-sectional view illustrating a water-cooling head assembly and an external pump of the liquid-cooling heat dissipating module according to the first embodiment of the present invention. FIG. 4 is a schematic exploded view illustrating the water-cooling head assembly and the external pump of the liquid-cooling heat dissipating module according to the first embodiment of the present invention. In this embodiment, the liquid-cooling heat dissipating module 1 comprises a water-cooling radiator 11, a water-cooling head assembly 12 and an external pump 13. The water-cooling radiator 11, the water-cooling head assembly 12 and the external pump 13 are in fluid communication with each other to define a sealed circulating loop. Moreover, a fluidic medium (not shown) is filled in the sealed circulating loop. As the fluidic medium flows within the sealed circulating loop, heat energy is transmitted from a higher temperature site to a lower temperature site of the liquid-cooling heat dissipating module 1. Consequently, the temperature at the higher temperature site is effectively decreased.

In this context, the external pump 13 is a pump unit that is independently and individually operated. The external pump 13 comprises a housing 130, a pump inlet 132, a pump outlet 133 and a fluid pusher (not shown). A sealed space for accommodating the fluidic medium is defined by the housing 130. The sealed space is a second chamber 131. The second chamber 131 will be described later.

The water-cooling head assembly 12 is attached on a heat source 8 of an external object 9 (see FIG. 2). After the heat from the heat source 8 is absorbed by the water-cooling head assembly 12, the heat is transferred to the water-cooling radiator 11 through the fluidic medium. Due to the heat exchange of the water-cooling radiator 11, the temperature is decreased. Moreover, the water-cooling head assembly 12 comprises a water-cooling head 121 and a bracket 122. The bracket 122 is contacted with the water-cooling head 121. When the bracket 122 is fixed on the external object 9 by screwing means, the water-cooling head 121 is clamped between the bracket 122 and the object 9. In this embodiment, the water-cooling head 121 has a flat bottom surface 1210. The flat bottom surface 1210 is contacted with the heat source 8 of the object 9. By means of the large-area contact, the heat exchange between the liquid-cooling heat dissipating module 1 and the heat source 8 of the object 9 is achieved quickly.

Please refer to FIGS. 2 and 3 again. The water-cooling head 121 comprises a first chamber 1211, a head inlet 1212 and a head outlet 1213. The first chamber 1211, the head inlet 1212 and the head outlet 1213 are in fluid communication with each other. The water-cooling head 121 is connected with the external pump 13 through the head inlet 1212 in order to receive the fluidic medium from the external pump 13. The water-cooling head 121 is connected with the water-cooling radiator 11 through the head outlet 1213 in order to transmit the fluidic medium to the water-cooling radiator 11.

Please refer to FIGS. 3 and 4 again. The external pump 13 further comprises a pump tube 134. The second chamber 131, the pump inlet 132, the pump outlet 133 and the pump tube 134 are in fluid communication with each other. The two ends of the pump tube 134 are connected with the pump outlet 133 and the head inlet 1212, respectively. Consequently, the water-cooling head 121 and the external pump 13 are in fluid communication with each other. The fluidic medium flows in the direction from the external pump 13 to the water-cooling head 121.

Figure 5:
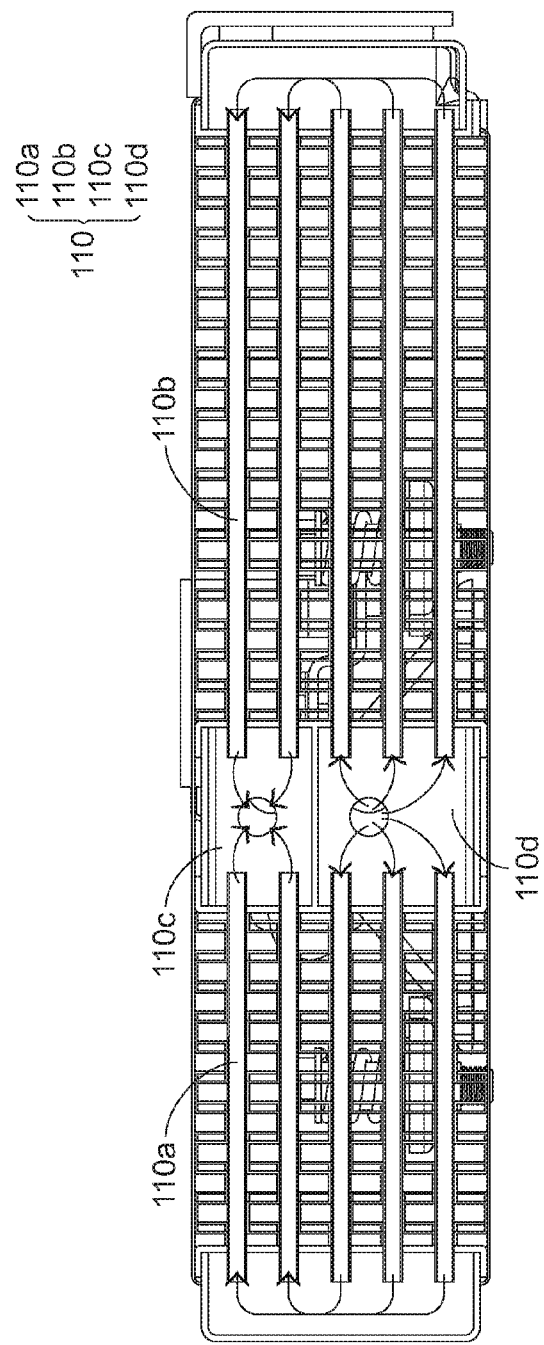
FIG. 5 is a schematic cross-sectional view illustrating the water-cooling radiator of the liquid-cooling heat dissipating module according to the first embodiment of the present invention.

FIG. 5 is a schematic cross-sectional view illustrating the water-cooling radiator of the liquid-cooling heat dissipating module according to the first embodiment of the present invention. Please refer to FIGS. 2 and 5. The water-cooling radiator 11 comprises a radiator inner channel 110, a radiator outlet tube 111 and a radiator inlet tube 112. The radiator inner channel 110, the radiator outlet tube 111 and the radiator inlet tube 112 are in fluid communication with each other. The head outlet 1213 of the water-cooling head 121 is connected with the radiator inlet tube 112 of the water-cooling radiator 11. After the heated fluidic medium having the higher temperature is outputted from the water-cooling head 121, the fluidic medium is introduced into the water-cooling radiator 11 through the radiator inlet tube 112. Due to the heat exchange of the water-cooling radiator 11, the temperature of the fluidic medium is decreased. Moreover, the radiator outlet tube 111 is connected with the pump inlet 132 of the external pump 13. After the temperature of the fluidic medium is decreased by the water-cooling radiator 11, the fluidic medium is introduced into the external pump 13 through the water-cooling radiator 11. Then, the fluidic medium in the external pump 13 is pressurized and pushed to the water-cooling head 121. Consequently, the fluidic medium can circularly flows within the liquid-cooling heat dissipating module 1.

Please refer to FIG. 5 again. The radiator inner channel 110 comprises a left communication channel part 110*a*, a right communication channel part 110*b*, an upper chamber 110*c* and a lower chamber 110*d*. The upper chamber 110*c* and the lower chamber 110*d* are separated from each other. The radiator inlet tube 112 is in communication with the lower chamber 110*d*. The radiator outlet tube 111 is in communication with the upper chamber 110*c*. The two ends of the left communication channel part 110*a* are connected with the upper chamber 110*c* and the lower chamber 110*d*, respectively. The two ends of the right communication channel part 110*b* are connected with the upper chamber 110*c* and the lower chamber 110*d*, respectively. After the fluidic medium is introduced into the lower chamber 110*d* through the radiator inlet tube 112, the fluidic medium separately flows toward the left side and the right side to the upper chamber 110*c* through the left communication channel part 110*a* and the right communication channel part 110*b*. The flowing directions of the fluidic medium are indicated by the arrows as shown in FIG. 5. After the fluidic medium is outputted from the upper chamber 110*c*, the fluidic medium is transmitted to the external pump 13 though the radiator outlet tube 111.

As shown in FIG. 2, the liquid-cooling heat dissipating module 1 further comprises two fan modules 19. The two fan modules 19 are arranged beside the left communication channel part 110*a* and the right communication channel part 110*b*, respectively. The two fan modules 19 are used for creating airflow and guiding the airflow toward the left communication channel part 110*a* and the right communication channel part 110*b*, respectively. By the airflow, the heat of the fluidic medium in the water-cooling radiator 11 is quickly dissipated to the surroundings. Consequently, the heat dissipating efficiency is enhanced.

As mentioned above, the fluidic medium flows within the sealed circulating loop. After the fluidic medium flows through the first chamber 1211, the head outlet 1213, the radiator inlet tube 112, the lower chamber 110*d*, the communication channel parts 110*a*/110*b*, the upper chamber 110*c*, the radiator outlet tube 111, the pump inlet 132, the second chamber 131, the pump outlet 133, the pump tube 134 and the head inlet 1212 sequentially, the fluidic medium returns back to the first chamber 1211.

Please refer to FIGS. 2, 3 and 4. The water-cooling head assembly 12 further comprises a position-limiting element 123. After the position-limiting element 123 is connected with the bracket 122, a clamping space is defined by the position-limiting element 123 and the bracket 122 collaboratively, and the external pump 13 is accommodated within the clamping space. That is, the external pump 13 is clamped and positioned by the position-limiting element 123 and the bracket 122. By the position-limiting element 123, the two independent components (i.e., the external pump 13 and the water-cooling head assembly 12) are contacted with each other. Consequently, the volume (i.e., the occupied space) of the liquid-cooling heat dissipating module 1 is effectively reduced.

Moreover, two bent supporting structures 1220 are extended from the bracket 122 in the direction away from the first chamber 1211. The position-limiting element 123 comprises a middle pressing part 1230 and two coupling parts 1231. The two coupling parts 1231 are respectively located at two ends of the middle pressing part 1230. The external pump 13 is covered and pressed by the middle pressing part 1230 of the position-limiting element 123. Moreover, the two coupling parts 1231 of the position-limiting element 123 are fixed on the two bent supporting structures 1220 by screwing means. Consequently, the external pump 13 is positioned on the bracket 122 through the position-limiting element 123.

Moreover, the bracket 122 is an I-shaped bracket. The bracket 122 comprises a middle supporting segment 1221 and two lateral supporting segments 1222. The two lateral supporting segments 1222 are respectively connected to the two ends of the middle supporting segment 1221. The water-cooling head 121 further comprises a concave structure 1214. The middle supporting segment 1221 is received within the concave structure 1214. The two lateral supporting segments 1222 are extended beyond the range of the water-cooling head 121. Each of the two lateral supporting segments 1222 comprises at least one fastening hole 1223. In this embodiment, each of the two lateral supporting segments 1222 comprises two fastening holes 1223. After fastening elements 1224 are penetrated through the corresponding fastening holes 1223 and tightened in the external object 9, the bracket 122 is fixed on the external object 9 by screwing means. It is noted that the way of fixing the associated components is not restricted to the screwing means. In some other embodiments, the associated components are connected with each other by welding means, adhering means or any other appropriate connecting means.

In an embodiment, the external pump 13 is a cylindrical pump. The pump inlet 132 is located at a bottom side of the cylindrical pump, and the pump outlet 133 is located at a lateral side of the cylindrical pump.

Figure 6:
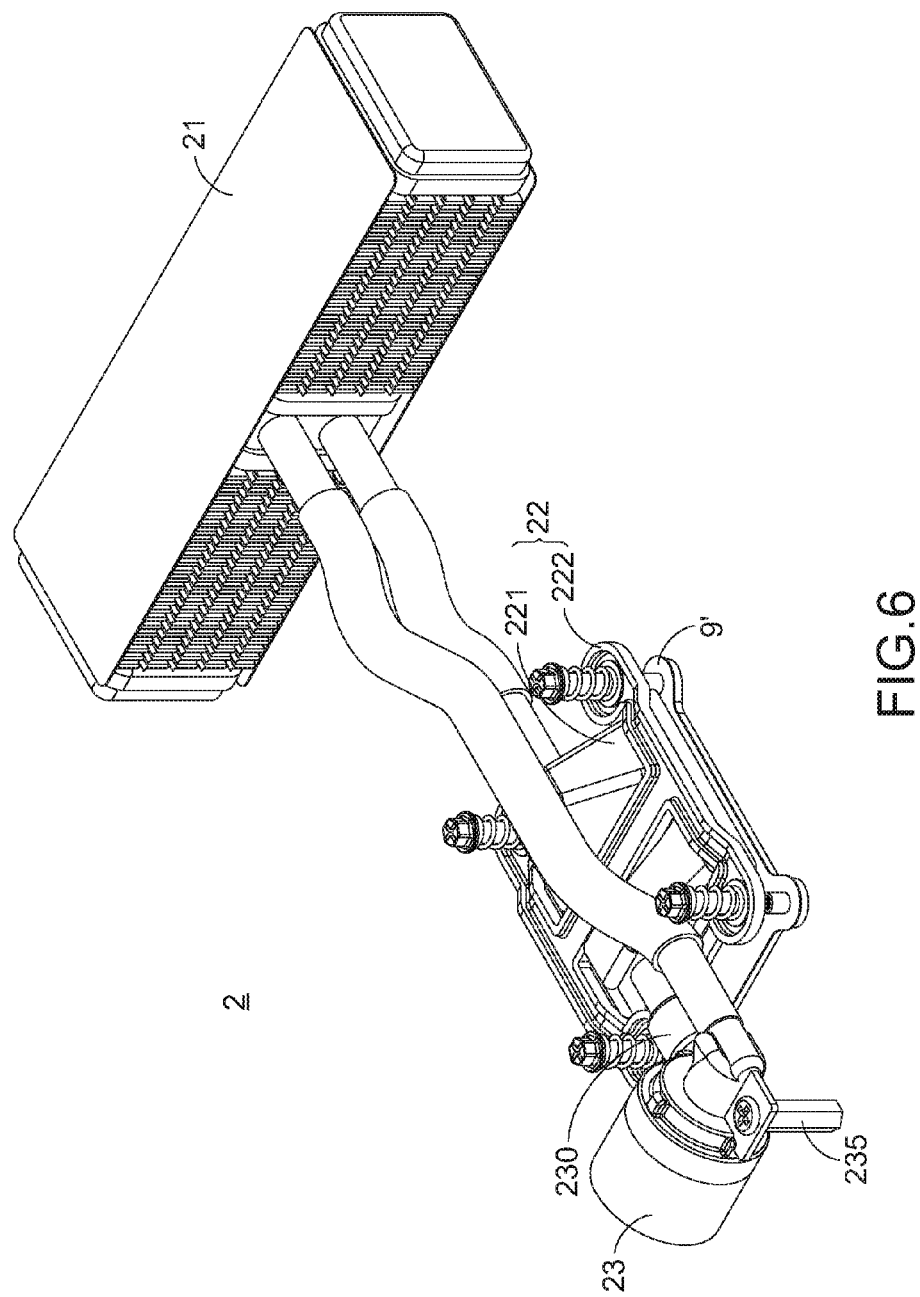
FIG. 6 is a schematic perspective view illustrating the architecture of a liquid-cooling heat dissipating module according to a second embodiment of the present invention.
Figure 7:
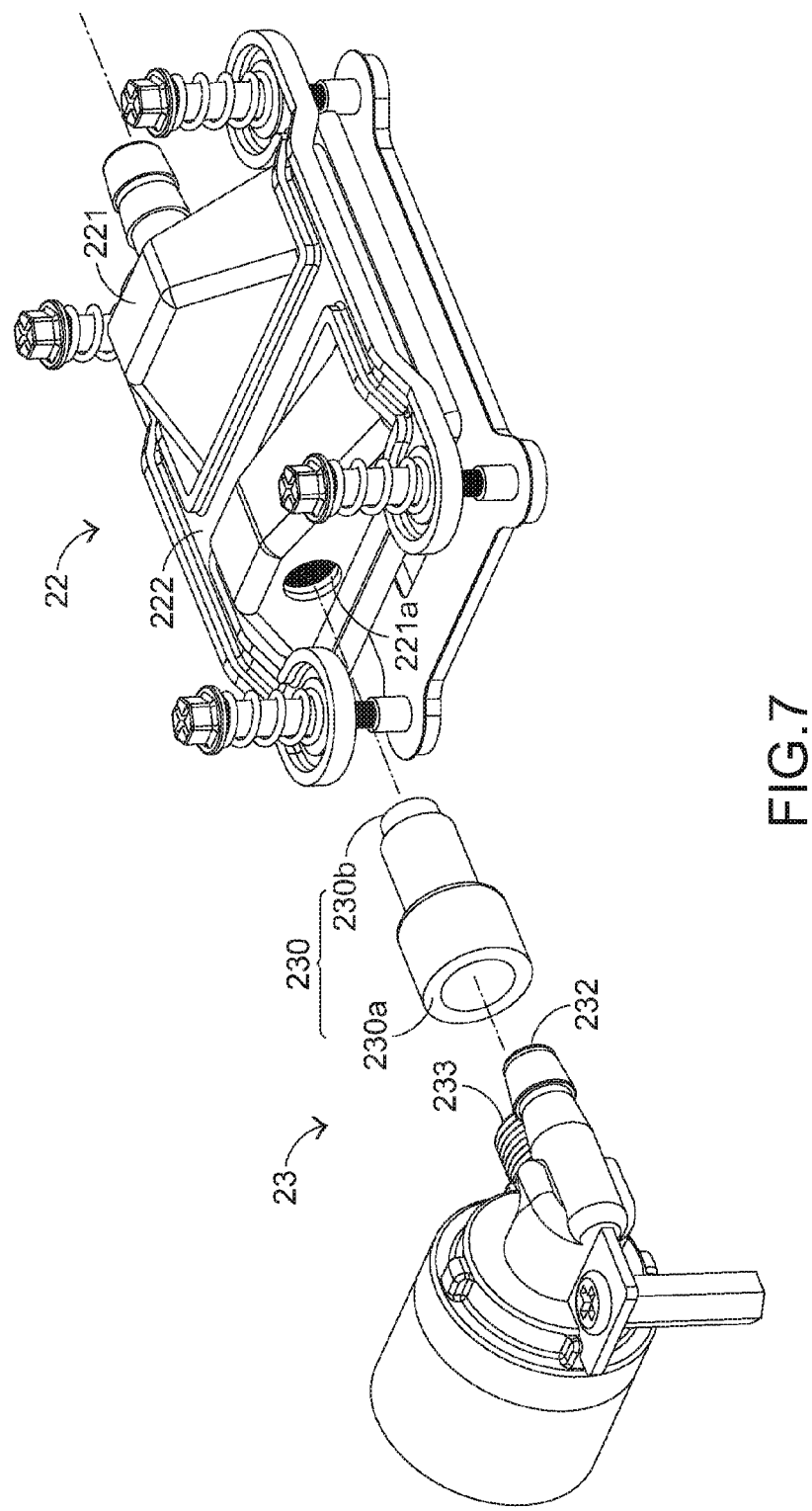
FIG. 7 is a schematic cross-sectional view illustrating a water-cooling head assembly and an external pump of the liquid-cooling heat dissipating module according to the second embodiment of the present invention.
Figure 8:
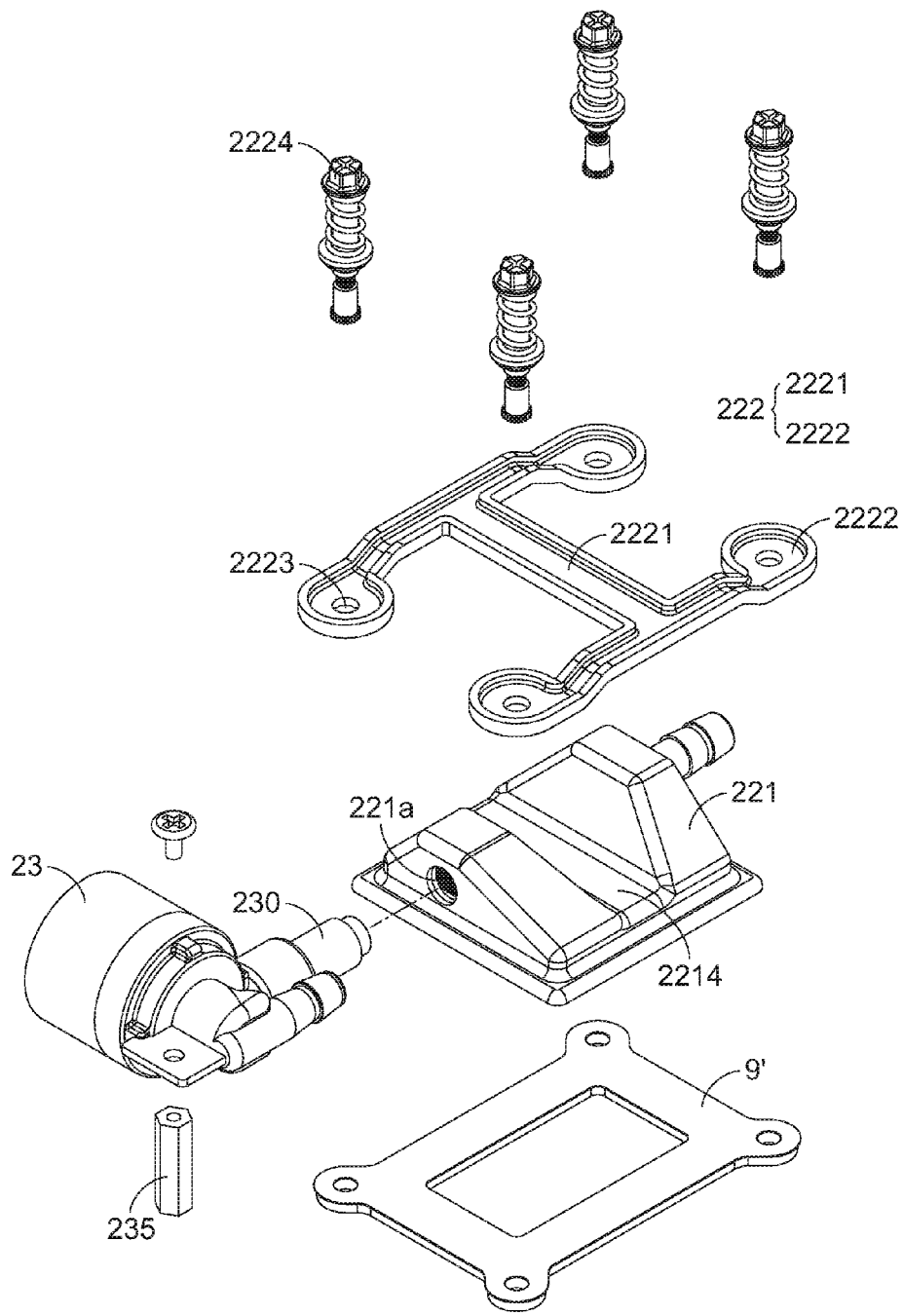
FIG. 8 is a schematic exploded view illustrating the water-cooling head assembly and the external pump of the liquid-cooling heat dissipating module according to the second embodiment of the present invention.

FIG. 6 is a schematic perspective view illustrating the architecture of a liquid-cooling heat dissipating module according to a second embodiment of the present invention. FIG. 7 is a schematic cross-sectional view illustrating a water-cooling head assembly and an external pump of the liquid-cooling heat dissipating module according to the second embodiment of the present invention. FIG. 8 is a schematic exploded view illustrating the water-cooling head assembly and the external pump of the liquid-cooling heat dissipating module according to the second embodiment of the present invention. The liquid-cooling heat dissipating module 2 of this embodiment is similar to the liquid-cooling heat dissipating module of the first embodiment. In this embodiment, the liquid-cooling heat dissipating module 2 comprises a water-cooling radiator 21, a water-cooling head assembly 22 and an external pump 23. The water-cooling radiator 21, the water-cooling head assembly 22 and the external pump 23 are in fluid communication with each other to define a sealed circulating loop. Moreover, a fluidic medium (not shown) is filled in the sealed circulating loop. As the fluidic medium flows within the sealed circulating loop, heat energy is transmitted from a higher temperature site to a lower temperature site of the liquid-cooling heat dissipating module 2. Consequently, the temperature at the higher temperature site is effectively decreased.

Similarly, water-cooling head assembly 22 is attached on an external object 9'. After the heat from the object 9' is absorbed by the water-cooling head assembly 22, the heat is transferred to the water-cooling radiator 21 through the fluidic medium and dissipated away by the water-cooling radiator 21. Moreover, the water-cooling head assembly 22 comprises a water-cooling head 221 and a bracket 222. The bracket 222 is contacted with the water-cooling head 221. The bracket 222 is fixed on the external object 9' by screwing means.

In comparison with the first embodiment, the external pump 23 of the liquid-cooling heat dissipating module 2 of this embodiment is distinguished. Similarly, the external pump 23 comprises a second chamber (not shown), a pump inlet 232 and a pump outlet 233. Moreover, the external pump 23 further comprises an adapter part 230. The external pump 23 is directly coupled with and fixed on the water-cooling head 221 through the adapter part 230. In this embodiment, the external pump 23 is directly coupled with the water-cooling head 221 through the adapter part 230 only. Moreover, the external pump 23 is positioned and fixed through the adapter part 230 and the water-cooling head 221. Moreover, the external pump 23 of this embodiment is not contacted with the bracket 222. In an embodiment, the external pump 23 is further fixed on the external object 9' or another object with the assistance of a coupling element 235.

In this embodiment, the adapter part 230 is an adapter ring. The two ends 230a and 230b of the adapter ring are respectively directly coupled with the pump outlet 233 and the head inlet 221a. In an embodiment, the head inlet 221a is made of a first material (e.g., a plastic material), and the pump outlet 233 is made of a second material (e.g., a metallic material). Under this circumstance, the two ends 230a and 230b of the adapter ring 230 are made of the plastic material and the metallic material, respectively. Since the components of the identical material are directly coupled with each other, the tightness at the joint is enhanced. Preferably but not exclusively, the adapter ring 230 is made of a hard material.

As mentioned above, the external pump 23 is contacted with the water-cooling head 221. Consequently, the layout space is saved. Moreover, since the longer pump tube of the first embodiment is not used in this embodiment, the pressure drop of the fluidic medium is effectively decreased. Moreover, the two independent components (i.e., the external pump 23 and the water-cooling head assembly 22) are contacted with each other. That is, when the external pump 23 and the water-cooling head 221 are directly coupled with each other, the external pump 23 and the water-cooling head assembly 22 are combined together. Consequently, the overall volume (i.e., the occupied space) of the liquid-cooling heat dissipating module 2 is effectively reduced.

In another embodiment, the head inlet 221a, the adapter part 230 and the pump outlet 233 are made of the same material. Consequently, the tightness at the joint is enhanced. In a further embodiment, the adapter part 230 is an extension part of the head inlet 221a and directly coupled with the pump outlet 233, or the adapter part 230 is an extension part of the pump outlet 233 and directly coupled with the head inlet 221a.

In this embodiment, the bracket 222 is also an I-shaped bracket. The bracket 222 comprises a middle supporting segment 2221 and two lateral supporting segments 2222. The two lateral supporting segments 2222 are respectively connected to the two ends of the middle supporting segment 2221. The water-cooling head 221 further comprises a concave structure 2214. The middle supporting segment 2221 is received within the concave structure 2214. The two lateral supporting segments 2222 are extended beyond the range of the water-cooling head 221. Each of the two lateral supporting segments 2222 comprises at least one fastening hole 2223. In this embodiment, each of the two lateral supporting segments 2222 comprises two fastening holes 2223. After fastening elements 2224 are penetrated through the corresponding fastening holes 2223 and tightened in the external object 9', the bracket 222 is fixed on the external object 9' by screwing means. It is noted that the way of fixing the associated components is not restricted to the screwing means. In some other embodiments, the associated components are connected with each other by welding means, adhering means or any other appropriate connecting means.

Figure 9:
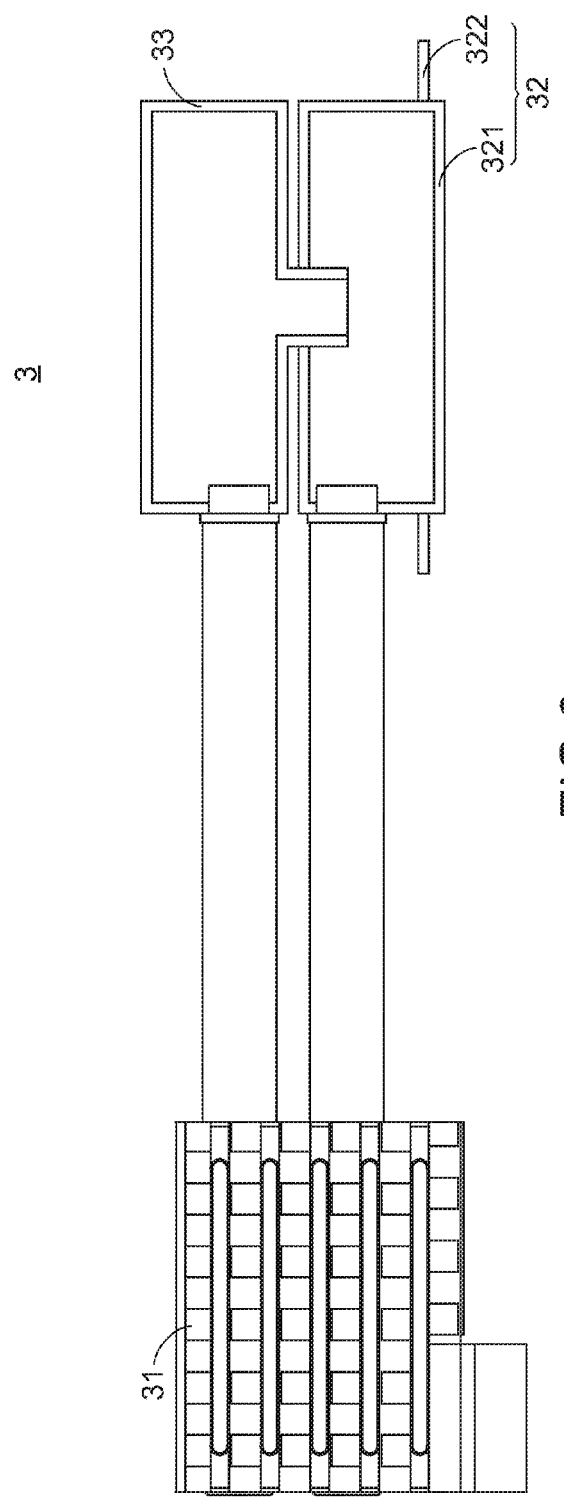
FIG. 9 is a schematic exploded view illustrating a water-cooling head assembly and an external pump of a liquid-cooling heat dissipating module according to a third embodiment of the present invention.

FIG. 9 is a schematic exploded view illustrating a water-cooling head assembly and an external pump of a liquid-cooling heat dissipating module according to a third embodiment of the present invention. The liquid-cooling heat dissipating module 3 of this embodiment is similar to the liquid-cooling heat dissipating module of the first embodiment. In this embodiment, the liquid-cooling heat dissipating module 3 comprises a water-cooling radiator 31, a water-cooling head assembly 32 and an external pump 33. The water-cooling radiator 31, the water-cooling head assembly 32 and the external pump 33 are in fluid communication with each other to define a sealed circulating loop. Moreover, a fluidic medium (not shown) is filled in the sealed circulating loop. Similarly, the water-cooling head assembly 32 of this embodiment comprises a water-cooling head 321 and a bracket 322. The bracket 322 is contacted with the water-cooling head 321. The bracket 322 is fixed on an external object by screwing means.

In this embodiment, the water-cooling radiator 31 and the water-cooling head assembly 32 are assembled-type components, but are not the one-piece components. That is, even if the water-cooling radiator 31 and the water-cooling head assembly 32 are not assembled with each other, the water-cooling radiator 31 and the water-cooling head assembly 32 have their own functions.

From the above descriptions, the present invention provides the liquid-cooling heat dissipating module. The external pump and the water-cooling head assembly of the liquid-cooling heat dissipating module are contacted and assembled with each other. Consequently, the layout space is saved, and more space is provided to accommodate other components. Moreover, since the external pump is directly coupled with the water-cooling head assembly, the pressure drop of the fluidic medium is decreased.

While the invention has been described in terms of what is presently considered to be the most practical and preferred embodiments, it is to be understood that the invention needs not be limited to the disclosed embodiments. On the contrary, it is intended to cover various modifications and similar arrangements included within the spirit and scope of the appended claims which are to be accorded with the broadest interpretation so as to encompass all modifications and similar structures.

What is claimed is:

1. A liquid-cooling heat dissipating module, comprising:
 a water-cooling radiator comprising a radiator inner channel, a radiator outlet tube and a radiator inlet tube;
 a water-cooling head assembly comprising a water-cooling head, a bracket and a position-limiting element, wherein the water-cooling head comprises a first chamber, a head inlet and a head outlet, the head outlet is connected with the radiator inlet tube, and the bracket is contacted with the water-cooling head and fixed on an external object; and
 an external pump contacted with the water-cooling head assembly, wherein the external pump comprises a second chamber, a pump inlet, a pump outlet and a pump tube, wherein two ends of the pump tube are connected with the pump outlet and the head inlet, respectively, wherein the radiator inner channel, the radiator outlet tube, the radiator inlet tube, the first chamber, the pump tube and the second chamber are in fluid communication with each other;
 wherein the position-limiting element is connected with the bracket, a clamping space is defined by the position-limiting element and the bracket collaboratively, the external pump is accommodated within the clamping space, and the external pump is clamped by the position-limiting element and the bracket.

2. The liquid-cooling heat dissipating module according to claim 1, wherein two bent supporting structures are extended from the bracket in a direction away from the first chamber, the position-limiting element comprises a middle pressing part and two coupling parts, and the two coupling parts are respectively located at two ends of the middle pressing part, wherein the external pump is covered and pressed by the middle pressing part of the position-limiting element, and the two coupling parts of the position-limiting element are fixed on the two bent supporting structures.

3. The liquid-cooling heat dissipating module according to claim 2, wherein the bracket is an I-shaped bracket, the I-shaped bracket comprises a middle supporting segment and two lateral supporting segments, the two lateral supporting segments are respectively connected to the two ends of the middle supporting segment, the water-cooling head further comprises a concave structure, the middle supporting segment is received within the concave structure, and the two lateral supporting segments are extended beyond the water-cooling head, wherein each of the two lateral supporting segments comprises at least one fastening hole, and at least one fastening element is penetrated through the corresponding fastening hole and tightened in the external object.

4. The liquid-cooling heat dissipating module according to claim 3, wherein the external pump is a cylindrical pump, wherein the pump inlet is located at a bottom side of the cylindrical pump, and the pump outlet is located at a lateral side of the cylindrical pump.

5. The liquid-cooling heat dissipating module according to claim 1, wherein the radiator inner channel comprises a left communication channel part, a right communication channel part, an upper chamber and a lower chamber, wherein the upper chamber and the lower chamber are separated from each other, the radiator inlet tube is in communication with the lower chamber, the radiator outlet tube is in communication with the upper chamber, two ends of the left communication channel part are respectively connected with the upper chamber and the lower chamber, and two ends of the right communication channel part are respectively connected with the upper chamber and the lower chamber, wherein after a fluidic medium is introduced into the lower chamber through the radiator inlet tube, the fluidic medium separately flows toward a left side and a right side to the upper chamber through the left communication channel part and the right communication channel part, and then the right communication channel part and the fluidic medium is introduced to the external pump though the radiator outlet tube.

6. The liquid-cooling heat dissipating module according to claim 5, wherein the liquid-cooling heat dissipating module further comprises two fan modules, and the two fan modules are arranged beside the left communication channel part and the right communication channel part, respectively, wherein the two fan modules guide airflow toward the left communication channel part and the right communication channel part, respectively.

* * * * *